United States Patent
Tijburg et al.

[11] Patent Number: 5,969,419
[45] Date of Patent: Oct. 19, 1999

[54] STRUCTURE COMPRISING PLATINUM LAYER BOUND TO A SURFACE OF A SILICON OXIDE LAYER

[75] Inventors: Rudolf P. Tijburg; Karel M. Van Der Waarde, both of Eindhoven, Netherlands

[73] Assignee: U.S. Philips Corporation, New York, N.Y.

[21] Appl. No.: 08/302,574

[22] Filed: Sep. 8, 1994

Related U.S. Application Data

[62] Division of application No. 08/134,499, Oct. 12, 1993, abandoned, which is a continuation of application No. 07/954,193, Sep. 29, 1992, abandoned.

[30] Foreign Application Priority Data

Oct. 1, 1991 [EP] European Pat. Off. .............. 91202550

[51] Int. Cl.⁶ ........................ H01L 23/48; H01L 23/52; H01L 29/40

[52] U.S. Cl. ............... 257/753; 257/743; 257/744; 257/748; 257/761; 257/763; 257/766; 257/768; 257/769

[58] Field of Search .................... 257/768, 769, 257/748, 753, 743, 744, 761, 763, 766

[56] References Cited

U.S. PATENT DOCUMENTS

| | | | |
|---|---|---|---|
| 3,629,022 | 12/1971 | Terry | 156/17 |
| 4,471,405 | 9/1984 | Howard et al. | 257/535 |

*Primary Examiner*—Carl W. Whitehead Jr.
*Assistant Examiner*—Alic W. Tang
*Attorney, Agent, or Firm*—Norman N. Spain

[57] ABSTRACT

By treating the silicon-oxide insulating layer of a semiconductor device with an aqueous metal-salt solution of a metal of an ion radius of less than 0.110 nm, for example, Sc, La or Zr, before a platinum electrode layer is provided on the insulating layer, the platinum layer shows excellent adhesive properties.

8 Claims, 1 Drawing Sheet

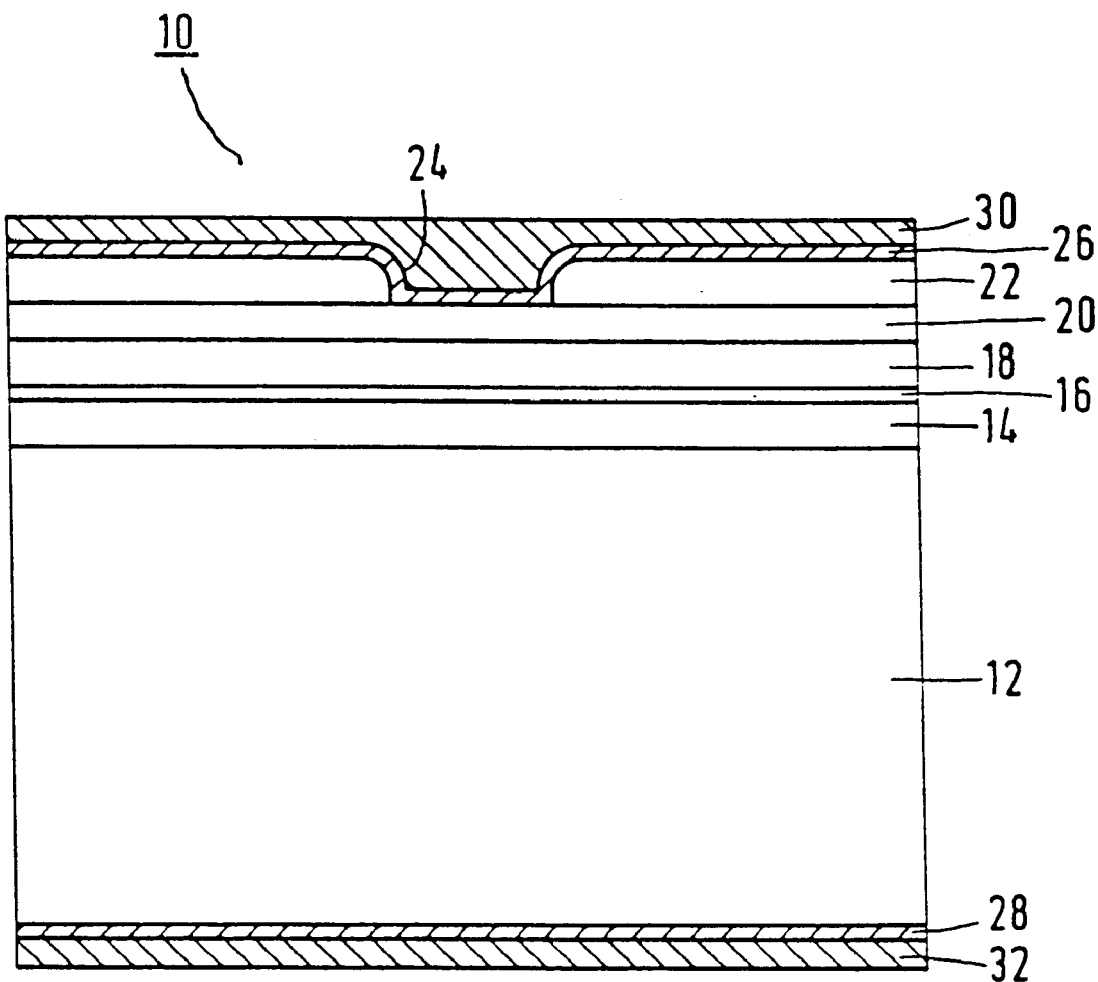

STRUCTURE COMPRISING PLATINUM LAYER BOUND TO A SURFACE OF A SILICON OXIDE LAYER

This is a division of application Ser. No. 08/134,499 filed Oct. 12, 1993 now abandoned which is a continuation of application Ser. No. 07/954,193, filed Sep. 29, 1992 now abandoned.

BACKGROUND OF THE INVENTION

The invention also relates to a method of manufacturing a semiconductor device comprising a semiconducting contact layer and a silicon oxide insulating layer which is located thereon and which has at least one aperture, as well as an electrode layer of platinum which is located on the insulating layer and which is in ohmic contact with the contact layer via said aperture and to such a semiconductor device, in particular a semiconductor laser.

Examples of the intended semiconductor devices are lasers, LEDs, integrated ferroelectric memories and microwave field effect transistors.

In European Patent Application EP-A-413491, a description is given of such a semiconductor device in the form of a semiconductor laser. The laser is built up of a number of layers of semiconducting material which contain InP or GaAs. One of said layers is the active layer which is bounded on both sides by, respectively, an n-type and a p-type cladding layer. One of said cladding layers carries a semiconducting contact or cap layer on which an insulating layer of silicon oxide is provided. Said insulating layer has one or more slit-shaped apertures on the inside of which a platinum electrode layer is in ohmic contact with the contact layer. The platinum layer extends over the insulating layer and is covered by a gold layer.

In the manufacture of such a semiconductor laser, use is made of a wafer of (mostly n-type) InP or GaAs on which the layers are provided by means of well-known techniques. Subsequently the wafer is cleaved (also termed dicing) to form laser chips. In this process the platinum layer may become completely or partly detached from the insulating layer, thereby rendering a part of the laser chips useless. In the above-mentioned Patent Application it is stated that a titanium layer having a thickness of 50 nm is located between the platinum layer and the silicon oxide layer. It is known per se that an intermediate layer of titanium may improve the adhesion of noble metals such as platinum to an oxidic substrate. Experiments carried out by Applicants have shown that in many cases the adhesion of a platinum layer to a silicon oxide surface, using an intermediate layer of titanium, is insufficient.

SUMMARY OF THE INVENTION

It is an object of the invention to provide, inter alia, a semiconductor device in which the adhesion between the platinum layer and the insulating layer of silicon oxide is substantially improved and in which the low contact resistance between the platinum layer and the semiconducting contact layer is preserved.

The invention further aims at providing a method of making a platinum layer adhere to a silicon oxide surface such that an excellent adhesion of the platinum layer is obtained at a relatively low process temperature.

A further object of the invention is to provide an improved method of manufacturing such a semiconductor device.

According to the invention these objects are achieved by a new and novel method of manufacturing a semiconductor device as described in the opening paragraph, which semiconductor device is characterized in that a boundary layer of the insulating layer adjoining the platinum electrode layer comprises a metal having an ion radius which is smaller than 0.110 nm and in that the enthalpy of formation of a binary compound of platinum with said metal has a negative value. The silicon oxide has a composition which broadly corresponds to $SiO_2$ and consists of a network of large negative oxygen ions and small positive silicon ions. Some metals can be built into the silicon oxide network at a later stage. Whether metals have said capacity depends on, inter alia, the ion radius of the metal in question. If the ion radius is too large the metal cannot be built into the silicon oxide in temperature conditions in which undesired mixing of or reactions between the various layers of the semiconductor device has not yet taken place. The maximum permissible temperature is approximately 650° C. It was found that metals having too large an ion radius, such as potassium (ion radius $K^+$=0.133 nm), silver (ion radius $Ag^+$=0.126 nm), lead (ion radius $Pb^{2+}$=0.120 nm), strontium (ion radius $Sr^{2+}$=0.112 nm) and mercury (ion radius $Hg^{2+}$=0.110 nm) are not built into the silicon oxide at a temperature below 650° C. and within practical processing times. The numerical values of the ion radii are those established by L. Pauling and can be found in, inter alia, "Handbook of Chemistry and Physics", CRC Press, Inc. $69^{th}$ Ed. (1988–1989), page F-164. Metals having an ion radius which is smaller than that of mercury, such as lanthanum (ion radius $La^{3+}$=0.1061 nm) can be incorporated in said silicon oxide. Some metals which can be built into the silicon oxide on the basis of their ion radius are not suitable because of the positive value of the enthalpy of formation ($\Delta H^{for}$) of a binary platinum-metal compound. This group of metals includes, inter alia, Au, Ir, Os, Pd and, of course, Pt. A positive enthalpy of formation is to be understood to mean that the formation of a binary platinum-metal compound takes up energy; a negative enthalpy of formation means that in the formation of such a compound energy is released. A negative enthalpy of formation has a favorable effect on the adhesion between platinum and another metal, for it is indicative of the formation of a chemical bond between the platinum and the metal. In general, the adhesion of the platinum will improve with an increase of the negative value of the enthalpy of formation. Numerical values of $\Delta H^{for}$ can be found in F. R. de Boer et al "Cohesion in Metals", 1988, NORTH-HOLLAND PUBLISHING COMPANY, Amsterdam, page 624 ff. The metal bringing about the improved adhesion between silicon oxide and platinum does not constitute a continuous layer on the silicon oxide, but is dispersed in the outermost ion layers (boundary layer) of the silicon oxide network. The platinum of the electrode layer is chemically bonded thereto.

Metals which are suitable according to the invention, i.e. which have an ion radius smaller than 0.110 nm and exhibit a negative enthalpy of formation of a corresponding binary metal compound with platinum are Li, Be, B, Mg, Al, Ca, Sc, Ti, V, Cr, Mn, Fe, Co, Ni, Cu, Zn, Ga, Ge, Y, Zr, Nb, Mo, La, Hf, Ta and W. Although strictly speaking boron is not a metal, boron has proved to be a suitable element. In particular Sc, La and Zr are very suitable because of their large negative enthalpies of formation of the corresponding binary platinum-metal compounds PtX, where X represents the metal in question, the enthalpies of formation being –132, –117 and –150 kJ/mol, respectively.

Further according to the invention, the object of providing an improved method of adhering a platinum layer to a silicon oxide surface is achieved by a method which is characterized in that, prior to providing the platinum layer, the silicon oxide surface is brought into contact with an aqueous solution of a salt of a metal selected from the group formed by Li, Be, B, Mg, Al, Ca, Sc, Ti, V, Cr, Mn, Fe, Co, Ni, Cu, Zn, Ga, Ge, Y, Zr, Nb, Mo, La, Hf, Ta and W, after which the silicon oxide surface is dried and annealed at a temperature of maximally 650° C., and in that following the provision of the platinum layer said layer is annealed at a temperature of maximally 500° C. and preferably 400° C.

BRIEF DESCRIPTION OF THE DRAWING

The sole FIGURE of the drawing is a diagrammatic sectional view of a semiconductor laser of the invention.

DETAILED DESCRIPTION OF THE INVENTION

The silicon oxide surface can be brought into contact with the aqueous metal-salt solution by, for example, immersing said silicon-oxide surface in said solution for a few seconds. The silicon-oxide surface should be hydrophilic. If this is not the case, the silicon-oxide surface is previously rendered hydrophilic by immersing it in an aqueous 1% by weight HF solution. The concentration of the metal salt is not critical and is, for example, 0.05–0.5 mol/l. After immersing the silicon-oxide surface in the metal-salt solution, the surface is dried by centrifuging and annealed at a temperature of, for example, 600° C. for 1 hour. The temperature treatment can be carried out in air, under vacuum or under a protective gas such as argon. Subsequently, the platinum layer is provided on the treated silicon-oxide surface. This is achieved by customary methods such as vacuum evaporation or sputtering. The platinum layer has a thickness of, for example, 100 nm. Subsequently, a second temperature treatment at maximally 500° C. is carried out, for example a temperature treatment at 400° C. for 20 minutes. At lower or higher temperatures the duration of the treatment has to be adapted, i.e. at a lower temperature the duration is increased, and conversely. Also the second annealing treatment can take place in air, under a vacuum or under a protective gas.

The salts of the the metals should, of course, be soluble in water. Owing to their substantial negative enthalpy of formation of binary platinum-metal compounds, in particular, the metals Sc, La and Zr are suitable. Suitable salts which are soluble in water are, for example, $ScF_3$, $La(NO_3)_3$ and $ZrF_4$. If the solubility in water of the salt to be used is insufficient, a complexing agent can be added to the solution. A suitable complexing agent is ethylenediaminetetraacetic acid or one of its sodium salts which are known under the trade names Trilon B, Complexone III, Sequestrene, Titriplex II, Versene and Chelaton 3. In general, the abbreviation EDTA is used to refer to disodium salt. Other suitable complexing agents are, for example, NTA or Complexone I (nitrilo tri-acetic acid) and CDTA (1,2-trans-cyclohexylene dinitrilo tetra-acetic acid). The complexing agent is added to the metal-salt solution in the molar ratio of approximately 1:1. The pH of the solution is adjusted to a value of approximately 7 or higher by means of ammonia to obtain optimum complexing of the metal ion. To promote homogeneous coating of the wafer with the metal-salt solution the viscosity of said solution is increased by adding, for example, 10–60 vol. % of ethylene glycol or glycerol.

The method according to the invention can be advantageously used for the manufacture of the above-mentioned semiconductor devices which comprise a silicon oxide insulating layer on which an adhering electrode layer of platinum must be provided.

The invention can be advantageously used in semiconductor lasers having a layer structure of III–V semiconducting compounds, such as compounds of the basis of GaP, GaAs and InP. Such layers are epitaxially grown on a III–V substrate. A well-known combination is that of GaAs and AlGaAs in lasers having an emission wavelength of approximately 800 nm for Compact Disc players and digital optical recording. Another well-known combination is that of InP and InGaAsP in lasers having an emission wavelength of 1.30 and 1.55 $\mu$m for use in optical telecommunications. As mentioned above, semiconductor devices such as lasers comprise a layered structure of InP- or GaAs compounds, a processing temperature exceeding approximately 650° C. having an adverse effect on the operation of the laser.

A further example of a semiconductor device which can be manufactured according to the present invention is an integrated ferroelectric memory which comprises a layer of, for example, $PbTiO_3$ or $PbZr_xTi_{1-x}O_3$ (PZT), an insulating layer of silicon oxide and a platinum electrode layer which adheres to said insulating layer.

The invention will be explained in greater detail by means of exemplary embodiments and a drawing, in which the sole FIGURE is a diagrammatic sectional view of a semiconductor laser.

Exemplary Embodiment 1

FIG. 1 is a diagrammatic sectional view of a semiconductor laser 10. A wafer of n-InP serves as a substrate 12 and has a thickness of 350 $\mu$m. By means of customary techniques (for example LPE=liquid phase epitaxy) this wafer is provided with, in succession, a cladding layer 14 of n-InP having a thickness of 1 $\mu$m, an active layer 16 of InGaAsP having a thickness of 0.3 $\mu$m, a cladding layer 18 of p-InP having a thickness of 1 $\mu$m and a contact layer 20 of p-InGaAsP having a thickness of 1 $\mu$m. Starting from $SiH_4$ and oxygen, a 0.15 $\mu$m thick insulating layer 22 of silicon oxide is provided on the contact layer 20 by means of Chemical Vapour Deposition at a temperature of 450° C. These and other details relating to the manufacture of the laser structure and which are not essential to the present invention can be found in the above-mentioned European Patent Application EP-A-413491 and in U.S. Pat. No. 4,595,491 the contents of which are (incorporated herein by reference).

The wafer with the thus formed layers is immersed in an aqueous solution containing 0.2 mol/l $ScF_3$ (ion radius $Sc^{3+}$=0.0732 nm) and 0.2 mol/l EDTA for a few seconds which solution is brought to a pH-value of 9.0 by means of ammonia. The binary PtSc compound has a $\Delta H^{for}$ of −132 kJ/mol. The wafer is dried by centrifuging and annealed in air at a temperature of 600° C. for 1 hour. Using customary methods, a strip-shaped aperture 24 having a width of approximately 5 $\mu$m is etched in the insulating layer 22, so that the underlying contact layer 20 is exposed at the location of said aperture. Subsequently, a platinum electrode layer 26 having a thickness of 100 nm is provided by sputtering. Next, the wafer is annealed in argon at a temperature of 400° C. for 20 minutes. The adhesion of the platinum layer 26 to the silicon oxide layer 22 is determined by means of the "tape test" in which a strip of adhesive tape is first pressed on the platinum layer and then pulled off, and by means of the "pull test" in which a stud is made to adhere to the platinum surface by means of a suitable adhesive after which it is subjected to a load by means of a tensile-strength tester. The load necessary to remove the stud is a measure of the adhesive power. When the above-described processing method is used, the adhesion of the platinum layer meets the requirements of the "tape test", i.e. the platinum layer or parts thereof do not become detached when the tape is pulled off. The adhesion measured by the tensile-strength tester is at least 15 N/mm$^2$. This measured value provides a distorted picture because the InP wafers are subject to breakage instead of the platinum becoming detached from the silicon oxide layer. The specific contact resistance between the platinum layer 26 and the p-type contact layer 20 is less than 10$^{-6}$ Ω.cm$^2$.

To complete the laser structure, the bottom side of the substrate 12 is provided with an electrode layer 28 of an AuGeNi alloy. Subsequently, gold layers 30 and 32 having a thickness of 0.8 μm are provided on both electrode layers 26 and 28 by means of vacuum evaporation, sputtering or electrodeposition to improve the solderability of said electrode layers. Next, the wafer is cleaved to form laser chips having parallel mirror facets.

Exemplary Embodiment 2

Exemplary embodiment 1 is repeated, with this difference that the ScF$_3$ solution is replaced by a solution of La(NO$_3$)$_3$.6H$_2$0 (ion radius La$^{3+}$=0.1061 nm). The concentration of this salt, the concentration of EDTA and the pH of the solution are equal to the corresponding concentrations of exemplary embodiment 1. ΔH$^{for}$ of the binary PtLa compound is −117 kJ/mol. The adhesion of the platinum layer meets the requirements of the "tape test" and the adhesion measured is at least 15 N/cm$^2$; i.e. the InP wafer is subject to breakage. The specific contact resistance between the platinum layer 26 and the p-type contact layer 20 is less than 10$^{-6}$ Ω.cm$^2$.

Exemplary Embodiment 3

Exemplary embodiment 1 is repeated, with this difference that the ScF$_3$ solution is replaced by a solution of ZrF$_4$ (ion radius Zr$^{4+}$=0.079 nm). The concentration of this salt, the concentration of EDTA and the pH of the solution are equal to the corresponding concentrations of exemplary embodiment 1. ΔH$^{for}$ of the binary PtZr compound is −150 kJ/mol. The adhesion of the platinum layer meets the requirements of the "tape test" and the measured adhesion is at least 15 N/mm$^2$; i.e. the InP wafer is subject to breakage. The specific contact resistance between the platinum layer 26 and the p-type contact layer 20 is less than 10$^{-6}$ Ω.cm$^2$.

Exemplary Embodiment 4

Exemplary embodiment 1 is repeated, with this difference that the ScF$_3$ solution is replaced by a solution of Fe(NO$_3$)$_3$ (ion radius Fe$^{3+}$=0.064 nm). The concentration of this salt, the concentration of EDTA and the pH of the solution are equal to the corresponding concentrations of exemplary embodiment 1. ΔH$^{for}$ or of the binary PtFe compound is −19 kJ/mol. The adhesion of the platinum layer meets the requirements of the "tape test" and the measured adhesion is at least 15 N/mm$^2$; i.e. the InP wafer is subject to breakage. The specific contact resistance between the platinum layer 26 and the p-type contact layer 20 is less than 10$^{-6}$ Ω.cm$^2$.

Exemplary Embodiment 5

Exemplary embodiment 1 is repeated, with this difference that the ScF$_3$ solution is replaced by an aqueous solution of 0.2 mol/l of boron acid. ΔH$^{for}$ of the binary PtB compound is −39 kJ/mol. The adhesion of the platinum layer meets the requirements of the "tape test" and the measured adhesion is at least 15 N/mm$^2$; i.e. the InP wafer is subject to breakage. The specific contact resistance between the platinum layer 26 and the p-type contact layer 20 is less than 10$^{-6}$ Ω.cm$^2$.

Comparative Example 1

Exemplary embodiment 1 is repeated, except that the treatment of the silicon oxide layer 22 with the aqueous solution of ScF$_3$ and EDTA is omitted. In the "tape test" the entire platinum layer is pulled off the silicon oxide layer. The "pull test" shows that the adhesion of the platinum layer to the silicon oxide layer is only approximately 0–1 N/Mm$^2$. The specific contact resistance between the platinum layer 26 and the p-type contact layer 20 is less than 10$^{-6}$ Ω.cm$^2$.

Comparative Example 2

Exemplary embodiment 1 is repeated, except that the ScF$_3$ solution is replaced by a solution of SrCl$_2$ (ion radius Sr$^{2+}$=0.112 nm). The concentration of this salt, the concentration of EDTA and the pH of the solution are equal to the corresponding concentrations of exemplary embodiment 1. ΔH$^{for}$ of the binary PtSr compound is −72 kJ/mol. In the "tape test" some parts of the platinum layer are pulled off the silicon oxide layer. The "pull test" shows that the adhesion of the platinum layer to the silicon oxide layer is only approximately 0–2 N/mm$^2$. The specific contact resistance between the platinum layer 26 and the p-type contact layer 20 is less than 10$^{-6}$ Ω.cm$^2$.

Comparative Example 3

Exemplary embodiment 1 is repeated, except that the ScF$_3$ solution is replaced by a solution of Hg(NO$_3$)$_2$ (ion radius Hg$^{2+}$=0.110 nm). The concentration of this salt, the concentration of EDTA and the pH of the solution are equal to the corresponding concentrations of exemplary embodiment 1. ΔH$^{for}$ of the binary PtHg compound is −25 kJ/mol. In the "tape test" some parts of the platinum layer are pulled off the silicon oxide layer. The "pull test" shows that the adhesion of the platinum layer to the silicon oxide layer is only approximately 0–2 N/mm$^2$. The specific contact resistance between the platinum layer 26 and the p-type contact layer 20 is less than 10$^{-6}$ Ω.cm$^2$.

Comparative Example 4

Exemplary embodiment 1 is repeated, with this difference that instead of treating the silicon oxide layer with a metal-salt solution, said layer is provided with a 50 nm thick titanium layer by means of vacuum evaporation before the platinum layer is provided. The "pull test" shows that the adhesion of the platinum layer to the silicon oxide layer is approximately 10 N/mm$^2$.

Microscopic examination shows that the silicon oxide layers treated with a metal-salt solution according to exemplary embodiments 1 up to and including 5 do not contain a metal layer. By means of AFM (Atomic Force Microscopy) and a scanning Auger multiprobe it is established that the metal in question (Sc, La, Zr, Fe and B) has diffused into a boundary layer over a distance of a few ions of the silicon oxide network.

The method according to the invention enables a high-quality adhesion of a platinum layer to a silicon oxide surface to be attained.

In the above examples a description is given of a semiconductor laser on the basis of InP. In the case of a semiconductor laser on the basis of GaAs, a substrate of n-GaAs is used and the active layer consists of GaAs and is bounded on both sides by, respectively, an n-type and a p-type AlGaAs cladding layer. The contact layer consists of p-GaAs.

We claim:

1. A structure comprising a layer of platinum bound to a surface of a silicon oxide layer, said structure being formed by bringing said surface into contact with an aqueous solution of a salt of a metal selected from the group consisting of Li, Be, B, Mg, Al, Ca, Sc, Ti, V, Cr, Mn, Fe, Co, Ni, Cu, Zn, Ga, Ge, Y, Zr, Nb, Mo, La, Hf, Ta, and W, drying said surface, annealing said surface at a temperature of not greater than 650° C., thereby forming a dispersion of said metal in said layer of silicon oxide to a depth of about a few ions below the surface of said layer, providing a layer of platinum on said annealed surface and then annealing the resultant structure at a temperature not greater than 500° C.

2. The structure of claim 1 wherein the metal of the instant salt is selected from the group consisting of Sc, La and Zr.

3. The structure of claim 1 wherein a complexing agent is added to the solution of the metal salt.

4. The structure of claim 3 wherein ethylenediaminetetraacetic acid or a salt thereof is used as the complexing agent.

5. The structure of claim 4 wherein a sodium salt of ethylenediaminetetraacetic acid is used as the complexing agent.

6. A semiconductor device comprising a semiconductor contact layer and a silicon oxide insulating layer located thereon and which insulating layer has at least one aperture and an electrode layer of platinum bound to a surface of the insulating layer and in contact with the semiconductor contact layer via said at least one aperture, said layer of platinum being bound to said surface of insulating layer by bringing said surface into contact with an aqueous solution of a salt of a metal selected from the group consisting of Li, Be, B, Mg, Al, Ca, Sc, Ti, V, Cr, Mn, Fe, Co, Ni, Cu, Zn, Ga, Y, Zr, Nb, Mo, La, Hf, Ta and W, drying said surface, annealing said dried surface at a temperature not greater than 650° C., thereby forming a dispersion of said metal in said insulating layer extending to a depth of about a few ions below the surface of said insulating layer, providing a layer of platinum on said annealed surface and then annealing the resultant device at a temperature of not greater than 500° C.

7. A semiconductor device comprising a platinum electrode bound to a surface of a silicon oxide insulating layer, said device being formed by bringing said silicon oxide surface into contact with an aqueous solution of a salt of a metal selected from the group consisting of Li, Be, B, Mg, Al, Ca, Sc, Ti, V, Cr, Mn, Fe, Co, Ni, Cu, Zn, Ga, Y, Zr, Nb, Mo, La, Hf, Ta and W, drying said surface, annealing said dried surface at a temperature not greater than 650° C., thereby forming a dispersion of said metal in said insulating layer of silicon oxide extending to a depth of about a few ions below the surface of said insulating layer, providing a layer of platinum on said annealed surface and then annealing the resultant device at a temperature not greater than 500° C.

8. A semiconductor laser comprising a platinum electrode bound to a surface of a silicon oxide insulating layer, said laser being formed by bringing said silicon oxide surface into contact with an aqueous solution of a salt of a metal selected from the group consisting of Li, Be, B, Mg, Al, Ca, Sc, Ti, V, Cr, Mn, Fe, Co, Ni, Cu, Zn, Gas, Ge, Y, Zr, Nb, Mo, La, Hf, Ta, and W, drying of said surface, annealing said dried surface at a temperature not greater than 650 C., thereby forming a dispersion of said metal in said silicon oxide insulating layer extending to a depth of about a few ions below the surface of said silicon oxide insulating layer, providing a layer of platinum on said annealed surface and then annealing the resultant laser at a temperature not greater than 500° C.

* * * * *